United States Patent
Lin et al.

(10) Patent No.: US 6,852,643 B1
(45) Date of Patent: Feb. 8, 2005

(54) METHOD FOR USING AMMONIUM FLUORIDE SOLUTION IN A PHOTOELECTROCHEMICAL ETCHING PROCESS OF A SILICON WAFER

(75) Inventors: Jing-Chie Lin, Jung-Li (TW); Chih-Chang Tsai, Jung-Li (TW); Chien-Ming Lai, Jung-Li (TW); Wen-Chu Hsiao, Jung-Li (TW)

(73) Assignee: National Central University, Taoyuan (TW)

( * ) Notice: Subject to any disclaimer, the term of this patent is extended or adjusted under 35 U.S.C. 154(b) by 0 days.

(21) Appl. No.: 10/673,349

(22) Filed: Sep. 30, 2003

(51) Int. Cl.[7] .............................................. H01L 21/302
(52) U.S. Cl. .................. 438/746; 438/750; 204/129.2; 204/129.3; 216/84; 216/94
(58) Field of Search .............................. 216/84, 87, 94; 204/129.2, 129.3, 129.4; 438/705, 746, 750

(56) References Cited

U.S. PATENT DOCUMENTS 4,482,443 A * 11/1984 Bacon et al. ............... 205/655
4,613,417 A * 9/1986 Laskowski et al. ........... 257/79

* cited by examiner

Primary Examiner—George A. Goudreau
(74) Attorney, Agent, or Firm—Rosenberg, Klein & Lee

(57) ABSTRACT

A method for using ammonium fluoride solution in a photoelectrochemical etching process of a silicon wafer, comprising steps of: placing a wafer after the pre-etching process into an alcohol solution for activating the surface of wafer and into an ammonium fluoride solution as an etching solution; and illuminating the back of wafer with a halogen light and performing a photoelectrochemical etching process in a potentiostatic.

7 Claims, 10 Drawing Sheets

METHOD FOR USING AMMONIUM FLUORIDE SOLUTION IN A PHOTOELECTROCHEMICAL ETCHING PROCESS OF A SILICON WAFER

BACKGROUND OF THE INVENTION

1. Field of the Invention

The present invention relates to a silicon wafer etching process, more particularity, to a photoelectrochemical etching process of silicon wafer which uses ammonium fluoride and halogen light illumination in the photoelectrochemical etching process.

2. Description of the Prior Art

Presently, wafer etching technology includes a dry-etching process and a wet-etching process.

Those etching processes have many advantages and disadvantages as follows:

|  | Dry-etching process | Wet-etching process | |
|---|---|---|---|
|  |  | Chemical Etching | Electrochemical Etching |
| Cost | Expensive | Cheap, but causes pollution | Very cheap |
| Production | Low | High | High |
| Aspect Ratio | >20:1 | >20:1 | >20:1 |
| Trench | below 0.5 μm | below 0.5 μm | below 0.5 μm |
| Appearance of etching hole | Excellent, but having many waves in hole wall | Normal | Excellent |
| Substrate | Etching direction impertinent to the substrate | Etching direction pertinent to the crystallization direction of substrate | Etching direction pertinent to the crystallization direction, semiconductor category and resistance of substrate |

Using the dry-etching process results in the best hole structure. Because the equipment is expensive and is hard to maintain, the production cost is higher. On the other hand, the wet-etching process could add to the production cost because the resultant pollution of crystallization surface and potassium ions.

The wet etching process was developed in 1958, Turner (Journal of the Electrochemical Society, vol. 105, pp. 402, 1958) disclosed a porous silicon layer on the surface of a silicon wafer using hydrofluoric acid solution in an electropolishing process. From 1958 to 1990, the development of the electropolishing process concentrated on decreasing the thickness of the silicon wafer, publishing process, and discussion on generating and application of a porous layer on an n-type silicon wafer. In 1990, Lehmann (Journal of the Electrocheminal Society, Vol. 137, pp. 653, 1990) first disclosed the macropore array with high density and high aspect ratio on the silicon wafer by the electropolishing process.

The conventional wet-etching used hydrofluoric acid as the etching solution. The hydrofluoric acid has odorless and unpalatable properties and easily forms fluoride, the boiling point is 19.54° C., is volatile and damages people at room temperature, the disadvantages are as follows:

1. The nose, throat, eyes and respiratory organs will be seriously damage by being exposed to air containing 122 ppm hydrofluoric acid for one minute.
2. People are killed by being exposed to air containing 50 ppm hydrofluoric acid for a couple of minutes (refer to the reference).
3. People are killed by being superficiously splashed with hydrofluoric acid.
4. Hydrofluoric acid easily reacts with the calcium of the human body to generate fluoride, which fluoride can lead to toxication, bone softening, changing sex and bone hardening.
5. Fluorine toxication leads diseases of the heart, nervous system and gut.

Further, the appearance of the hole is not smooth and equable by using hydrofluoric acid as an etching solution in the wet-etching process, so the results are unacceptable.

SUMMARY OF THE INVENTION

It is an object of the present invention is to provide a method for using ammonium fluoride solution in a photoelectrochemical etching process of a silicon wafer which uses ammonium fluoride for a highly safe and rapid etching solution It is another object of the present invention to provide a method for using ammonium fluoride solution in a photoelectrochemical etching process of a silicon wafer which can generate excellent and smoothly etched holes by using ammonium fluoride solution.

The present invention discloses a method for generating the macropore array on a silicon wafer to produce a super capacitor, chemosensor, filter and bio-sensor. The present invention uses pure ammonium fluoride to replace the conventional hydrofluoric acid as an etching solution. The silicon wafer has smooth deep-holes under controlled light and potential in the photoelectrochemical etching process.

The conventional etching solution is replaced by observing the etching performance, and produces deep-holes according to the proper concentration and type of etching solution, emitted light and potential in the photoelectrochemical etching process.

BRIEF DESCRIPTION OF THE DRAWINGS

The above and further objects, features and advantages of the invention will become clear from the following more detailed description when read with reference to the accompanying drawings in which.

Figure 7:
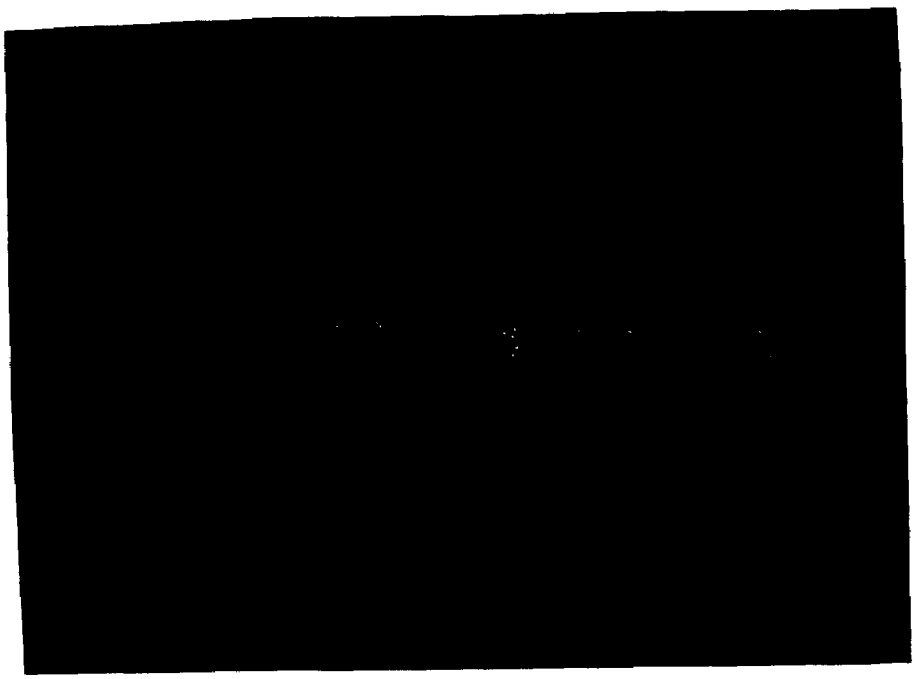
Figure 8:
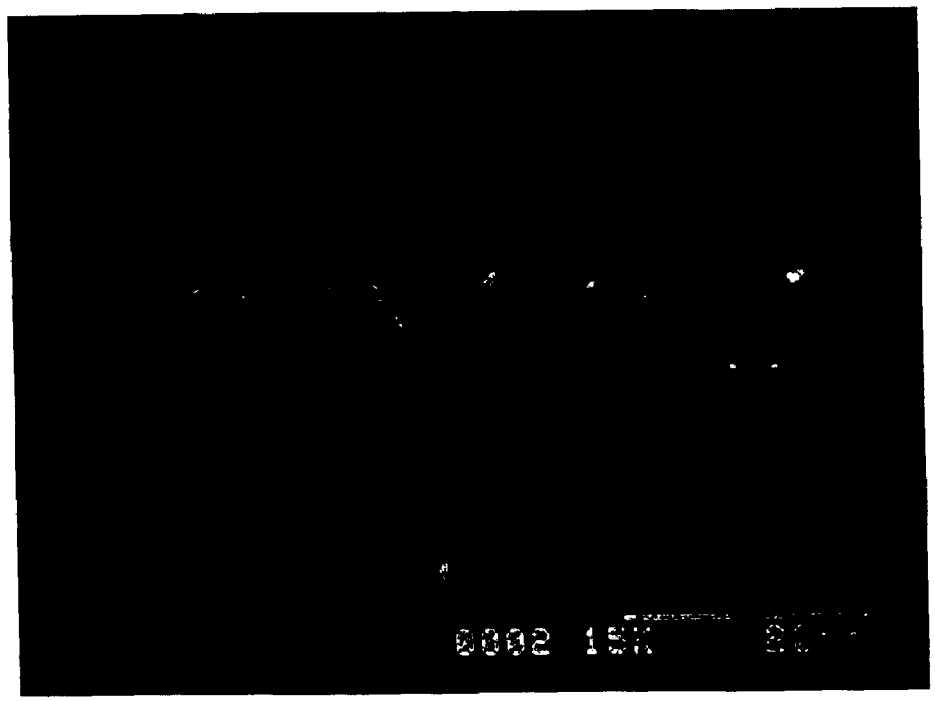
Figure 9:
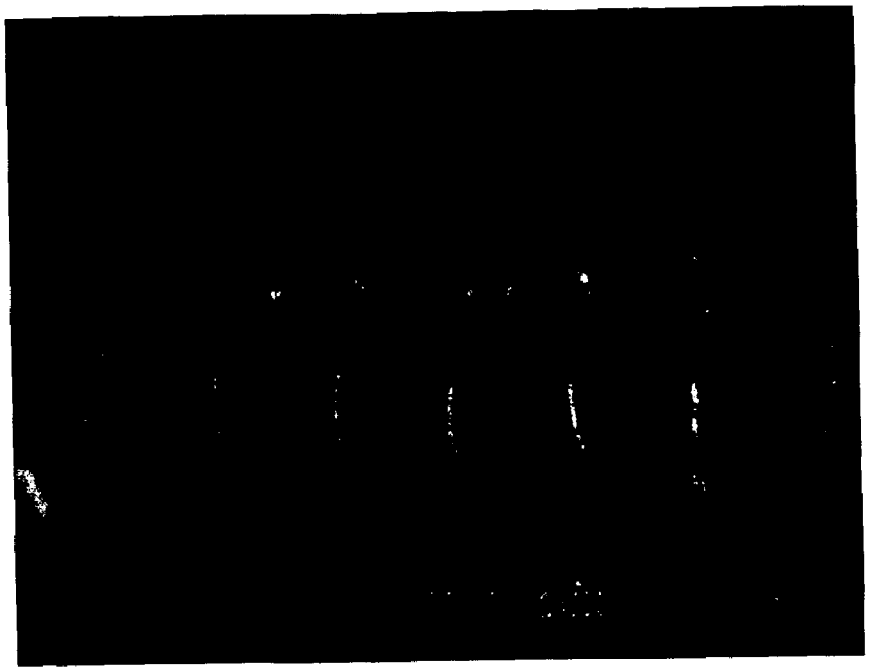
Figure 10:
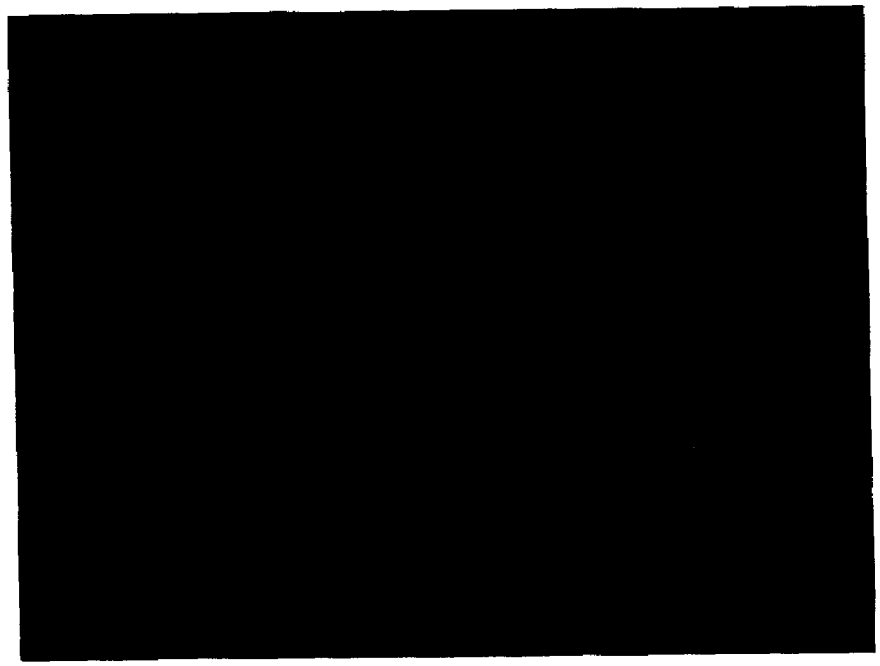
Figure 11:
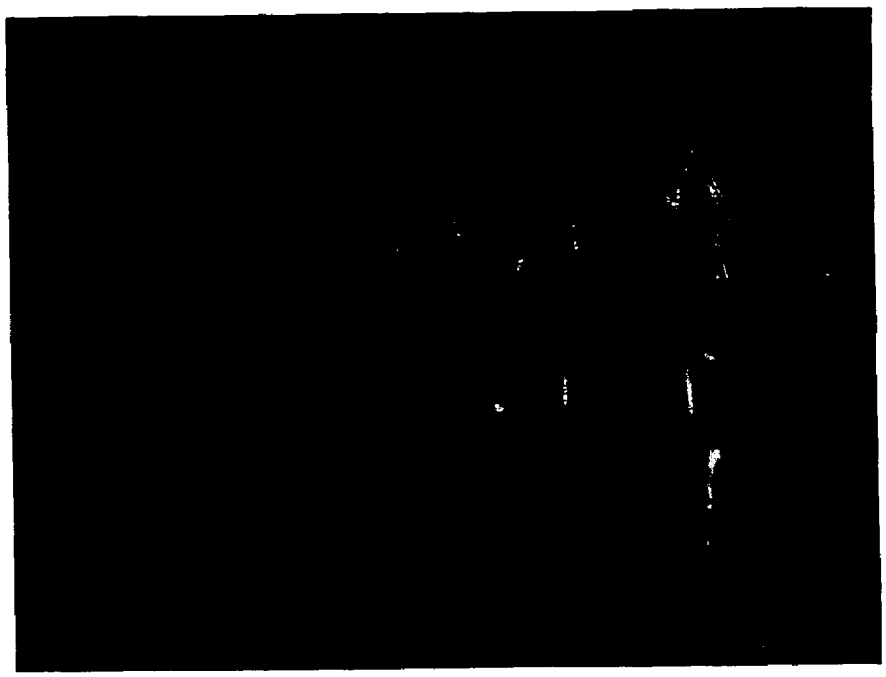
Figure 12A:
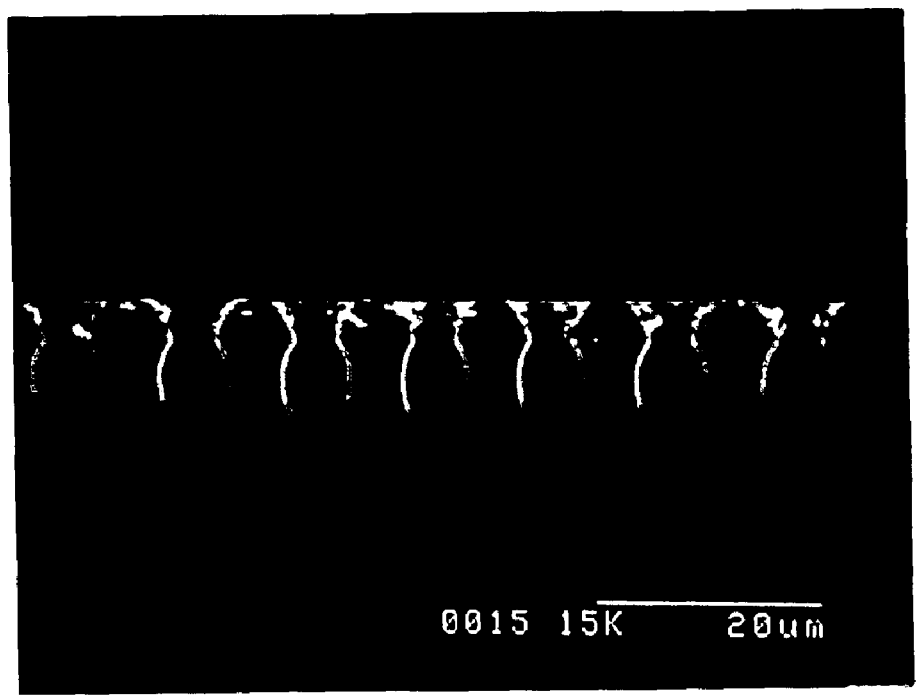
Figure 12B:
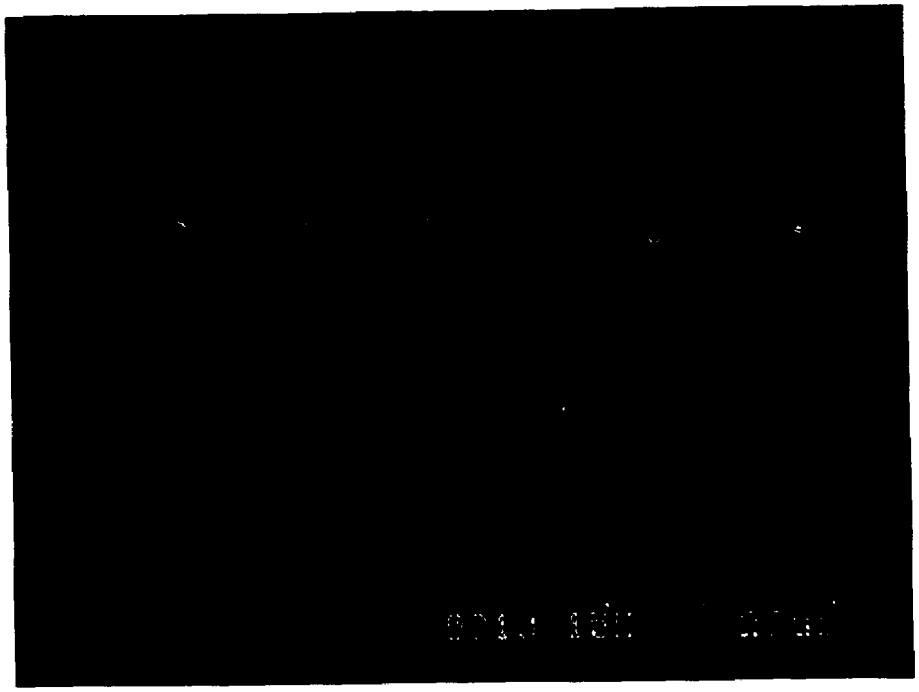
Figure 13:
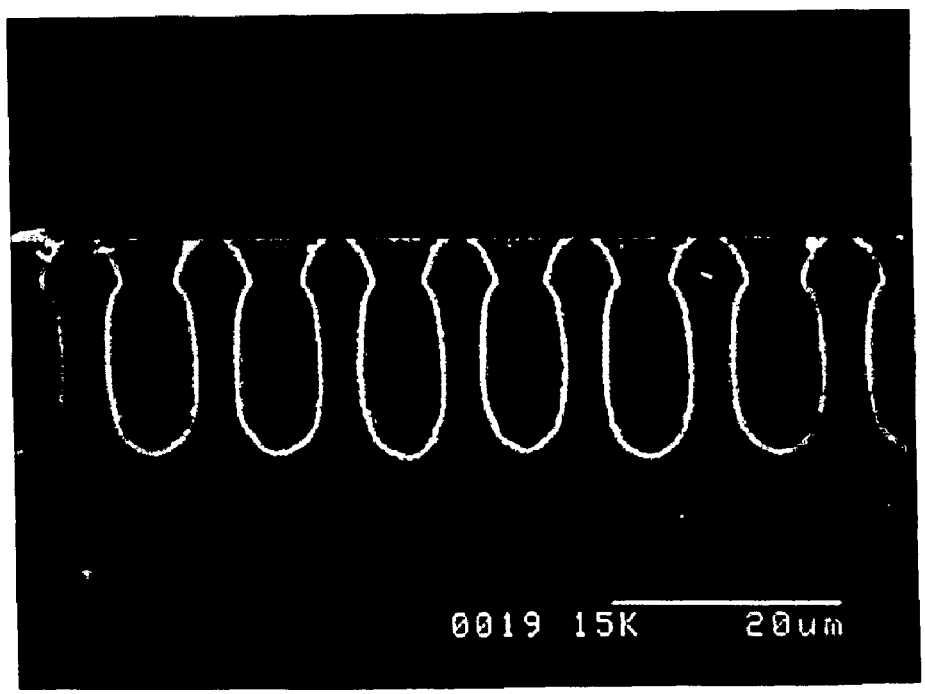
Figure 14:
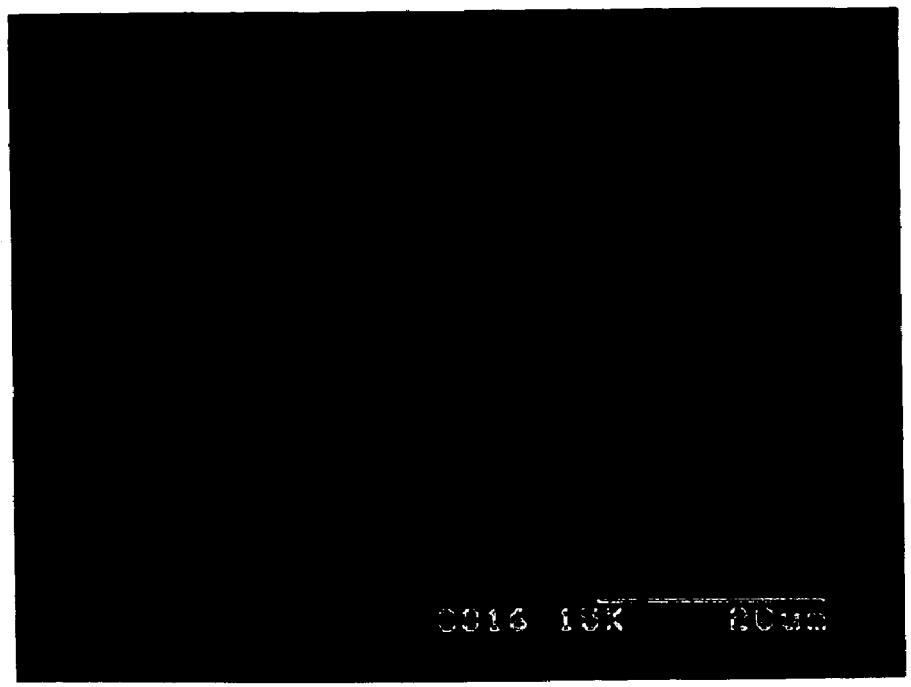
Figure 15:
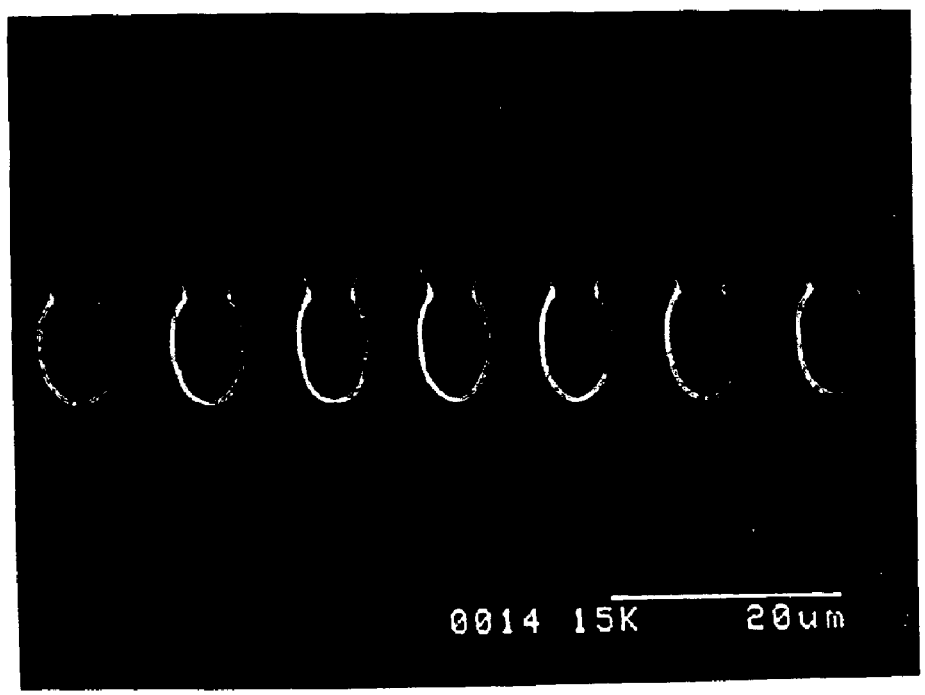
Figure 16:
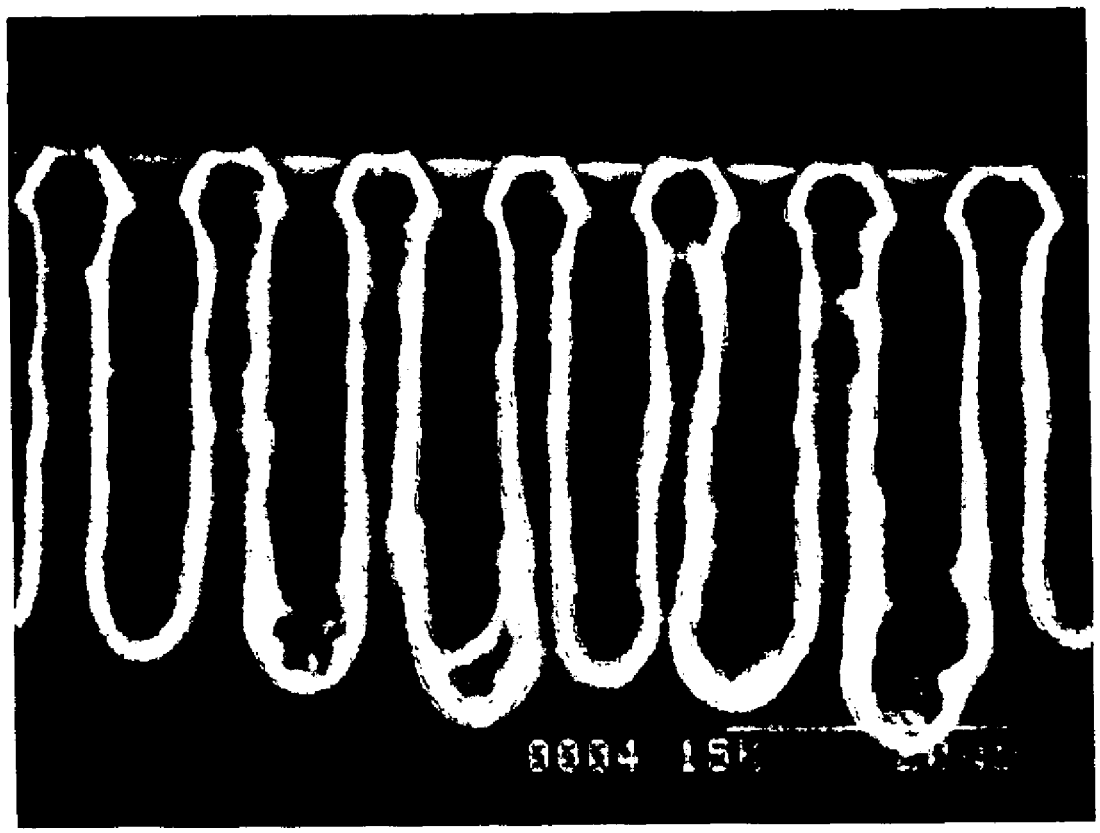

FIG. 7 is an SEM micrograph of the etched holes on an n-type silicon, formation by potentiostatic etching at 250 mV (vs.SCE) for 10800 seconds under emitting by 50 W, 20000 Lx halogen light, according to an embodiment of the present invention;

FIG. 8 is an SEM micrograph of the etched holes on an n-type silicon, formation by potentiostatic etching at 500 mV (vs.SCE) for 10800 seconds under emitting by 50 W, 20000 Lx halogen light, according to an embodiment of the present invention;

FIG. 9 is an SEM micrograph of the etched holes on an n-type silicon, formation by potentiostatic etching at 1000 mV (vs.SCE) for 3600 seconds under emitting by 50 W, 20000 Lx halogen light, according to an embodiment of the present invention;

FIG. 10 is an SEM micrograph of the etched holes on an p-type silicon, formation by potentiostatic etching at 500 mV (vs.SCE) for 10800 seconds under emitting by 50 W, 20000 Lx halogen light, according to an embodiment of the present invention;

FIG. 11 is an SEM micrograph of the etched holes on an n-type silicon, formation by potentiostatic etching at 1000 mV (vs.SCE) for 10800 seconds under emitting by 50 W, 20000 Lx halogen light, according to an embodiment of the present invention;

FIG. 12A is an SEM micrograph of the etched morphology of an n-type wafer resulted from photoelectrochemical etching in the conversional solution of 2.1 M hydrofluoric acid solution containing 15.8 M ethonal solution for 3600 seconds, where a potential of 500 mV (vs. SCE) was applied and the wafer was emitted by 50 W, 20000 Lx halogen light, according to an embodiment of the present invention;

FIG. 12B is an SEM micrograph of the etched morphology of an n-type wafer resulted from photoelectrochemical etching in the solution of 2.1 M ammonium fluoride solution containing 1 M ammonium chloride solution for 3600 seconds, where a potential of 500 mV (vs. SCE) was applied and the wafer was emitted by 50 W, 20000 Lx halogen light, according to an embodiment of the present invention;

FIG. 13 is an SEM micrograph of the etched morphology of an n-type wafer resulted from photoelectrochemical etching in the solution of 2.1 M ammonium fluoride solution containing 0.5 M ammonium chloride solution for 3600 seconds, where a potential of 500 mV (vs. SCE) was applied and the wafer was emitted by 50 W, 20000 Lx halogen light, according to an embodiment of the present invention;

FIG. 14 is an SEM micrograph of the etched morphology of an n-type wafer resulted from photoelectrochemical etching in the solution of 2.1 M ammonium fluoride solution containing 1.5 M ammonium chloride solution for 3600 seconds, where a potential of 500 mV (vs. SCE) was applied and the wafer was emitted by 50 W, 20000 Lx halogen light, according to an embodiment of the present invention;

FIG. 15 is an SEM micrograph of the etched morphology of an n-type wafer resulted from photoelectrochemical etching in the solution of 2.1 M ammonium fluoride solution containing 0.5 M ammonium chloride solution for 10800 seconds, where a potential of 50 mV (vs. SCE) was applied and the wafer was emitted by 50 W, 20000 Lx halogen light at 10° C., according to an embodiment of the present invention; and FIG. 16 is an SEM micrograph of the etched morphology of an n-type wafer resulted from photoelectrochemical etching in the solution of 2.1 M ammonium fluoride solution containing 0.5 M ammonium chloride solution for 3600 seconds, where a potential of 500 mV (vs. SCE) was applied and the wafer was emitted by 50 W, 20000 Lx halogen light at 95° C., according to an embodiment of the present invention;

DETAILED DESCRIPTION OF THE PREFERRED EMBODIMENTS

The present invention discloses a method for generating matrix deep etching holes of a silicon wafer in a photoelectrochemical etching process.

Figure 1:
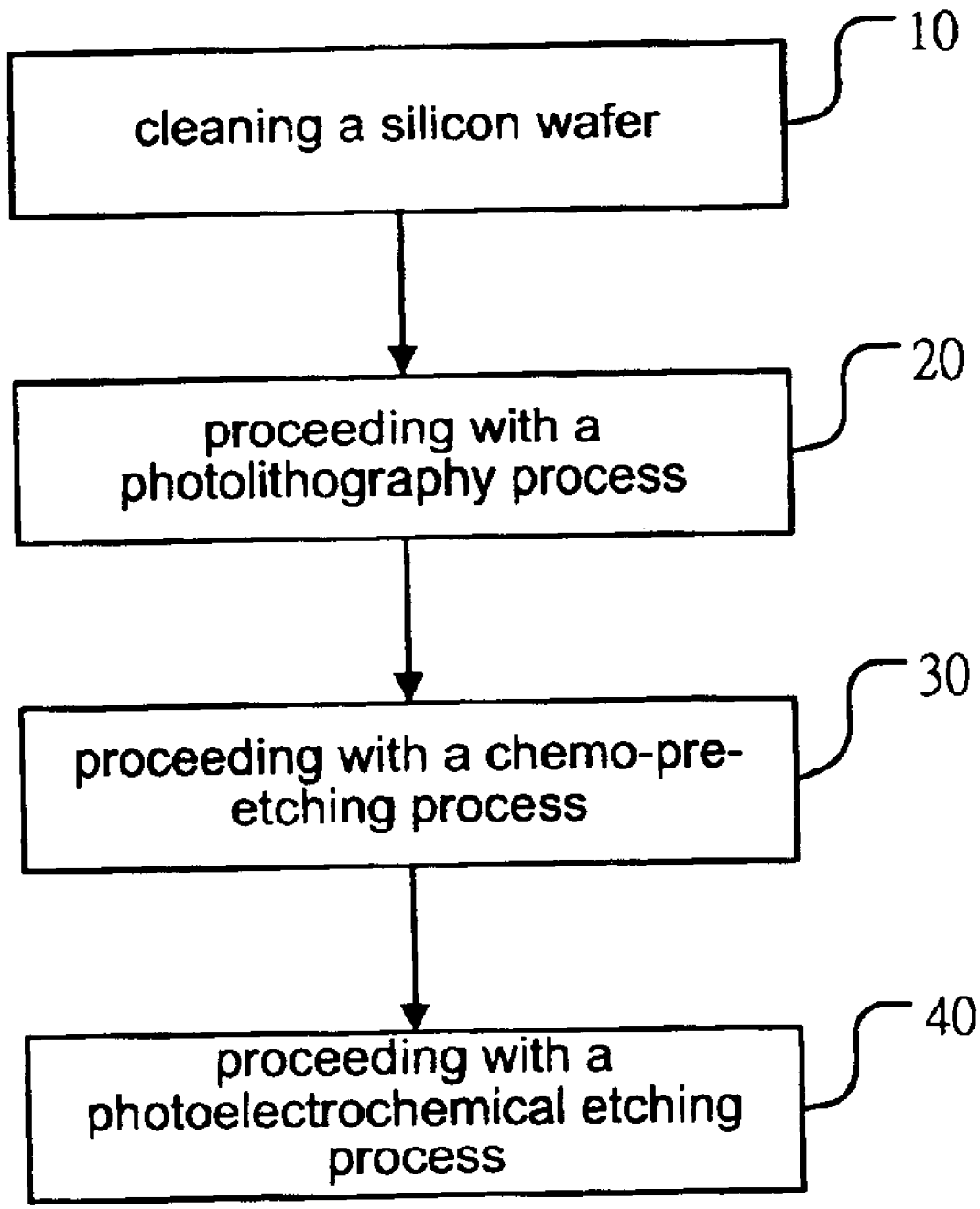
FIG. 1 is a flow chart for an photoelectrochemical etching process according to an embodiment of the present invention.

Refer to FIG. 1, the present invention comprises a steps of:

Step 10, cleaning a silicon wafer,
Step 20, proceeding with a photolithography process;
Step 30, proceeding with a chemo-pre-etching process; and
Step 40, proceeding with a photoelectrochemical etching process.

At step 10, the surface of the silicon wafer grows a thickness from 1000 to 2000 angstroms of silicon dioxide and 1000 angstroms silicon nitride and cleans up in a standard RCA clean process.

At step 20, the photolithography was used to transfer the designed pattern on the wafer surface, and using the reactive ion etching generates the pattern of silicon nitride on the wafer surface.

At step 30, placing the wafer into a 45 w.t % potassium hydroxide solution and heating 70° C., maintaining for 7 minutes etches the inverted pyramid pattern micro-structure by chemo-anisotropic etching process. The inverted pyramid pattern micro-structure of the wafer is placed into an alcohol solution for activating the surface of the wafer.

At step 40, placing the wafer into an ammonium fluoride solution,illuminating the back of the wafer with halogen light and etching in a potentiostatic will generate the matrix deep-hole micro-structure of wafer.

Figure 2:
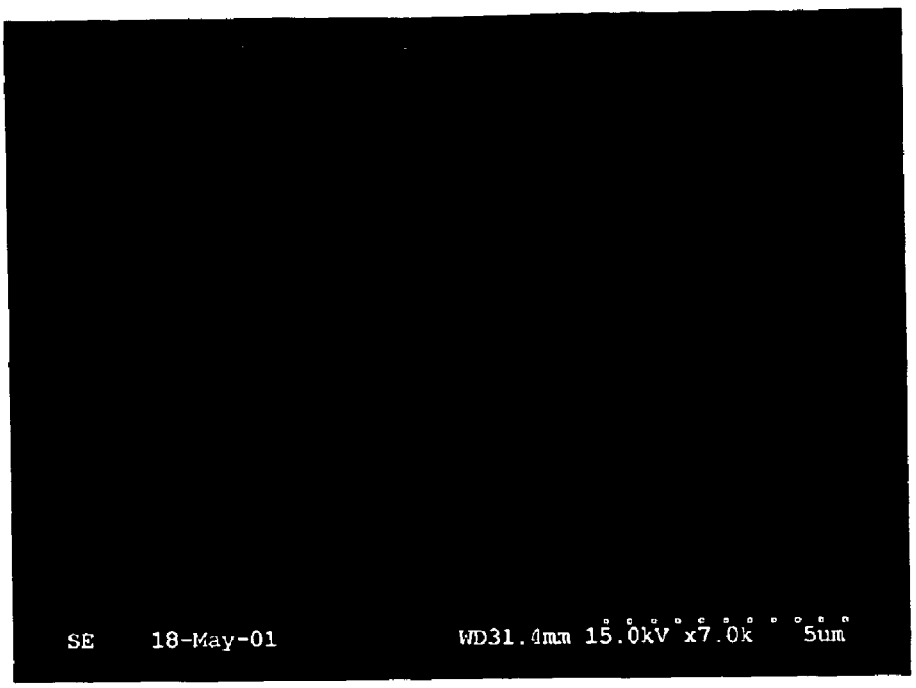
FIG. 2 is an SEM micrograph of etched holes of an n-type wafer according to an embodiment of the present invention.
Figure 3:
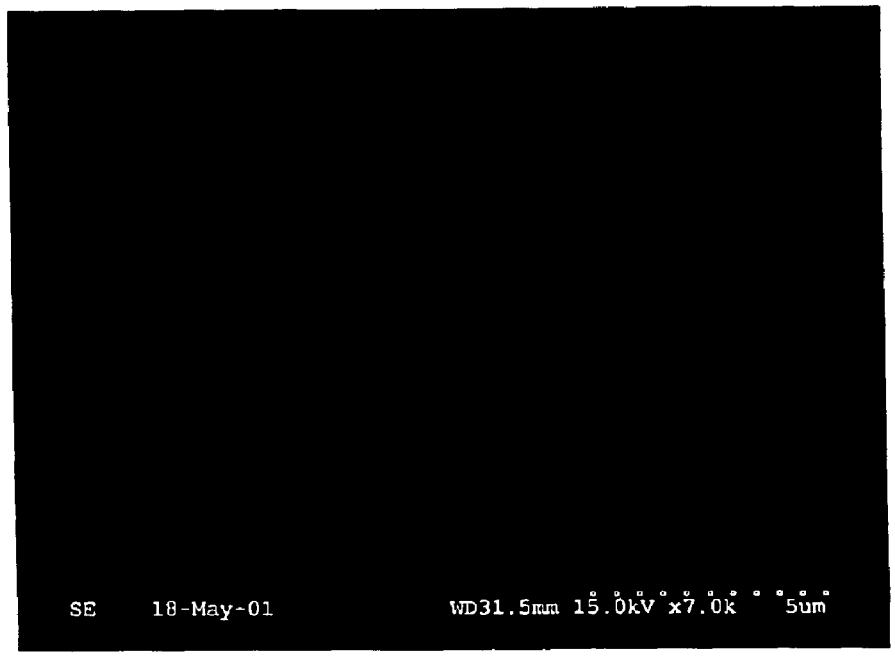
FIG. 3 is an SEM micrograph of the etched holes for the electrochemical etching process of the prior art.
Figure 4A:
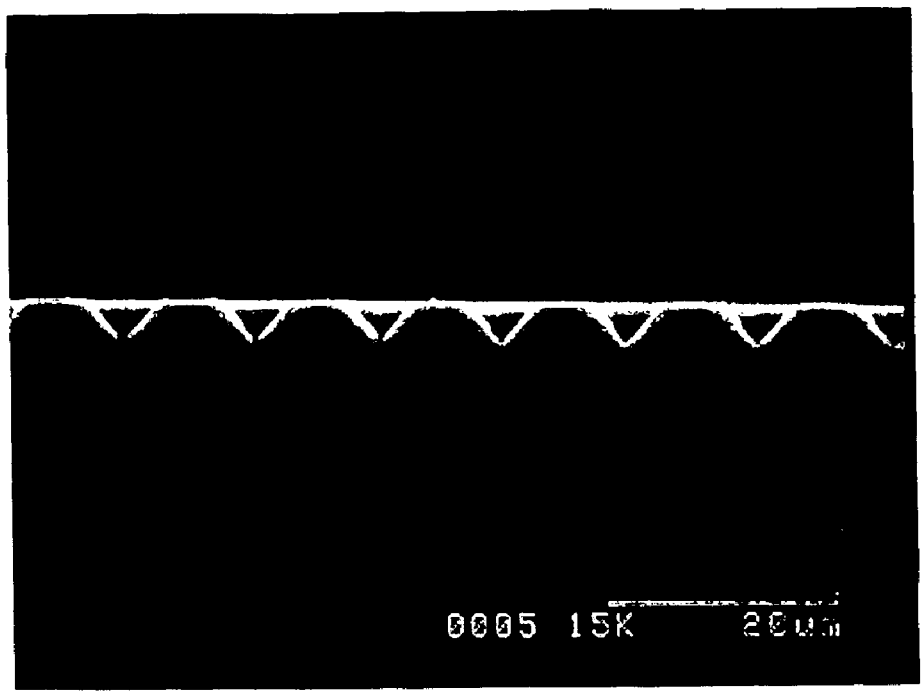
FIG. 4A is an SEM micrograph of the etched holes on an n-type silicon, formation by potentiostatic etching at 500 mV (vs.SCE) for 3600 seconds, according to an embodiment of the present invention.

Comparing the results of the conventional and the present invention: FIG. 4A is an SEM micrograph of the etched holes on an n-type silicon, formation by potentiostatic etching at 500 mV (vs.SCE) for 3600 seconds, according to an embodiment of the present invention;

FIG. 16 is an SEM micrograph of the etched morphology of an n-type wafer resulted from photoelectrochemical etching in the solution of 2.1 M ammonium fluoride solution containing 0.5 M ammonium chloride solution for 3600 seconds, where a potential of 500 mV (vs. SCE) was applied and the wafer was emitted by 50 W, 20000 Lx halogen light at 95° C., according to an embodiment of the present invention;

1. After pre-etching the n-type wafer put into the 2.1 M ammonium fluoride solution and a potential of 500 mV (vs. SCE) was applied. Illuminating the back of the wafer with 50 W, 20000 Lx halogen light and etching for 7200 seconds can generate deep-hole structure (refer to FIG. 2). The conventional method uses 2.1 M hydrofluoric acid and 15.8 M alcohol solution in an electrochemical etching process to get the structure (refer to FIG. 3). The photoelectrochemical etching process according to an embodiment of the present invention generates a smoother and more constant and even hole structure than the conventional electrochemical etching process.

Figure 4B:
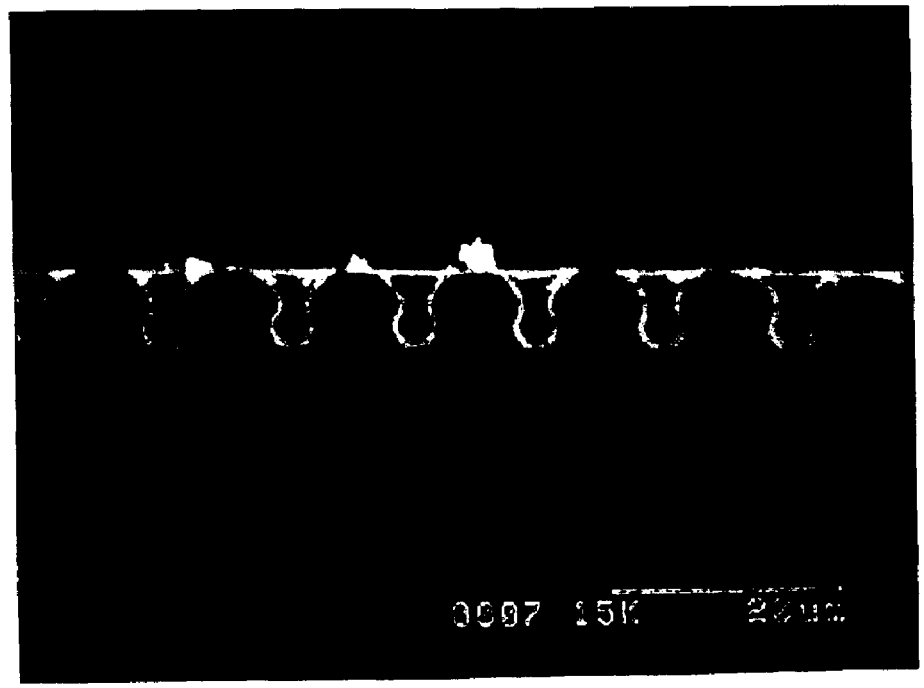
FIG. 4B is an SEM micrograph of the etched holes on an p-type silicon, formation by potentiostatic etching at 500 mV (vs.SCE) for 3600 seconds, according to an embodiment of the present invention.
Figure 5:
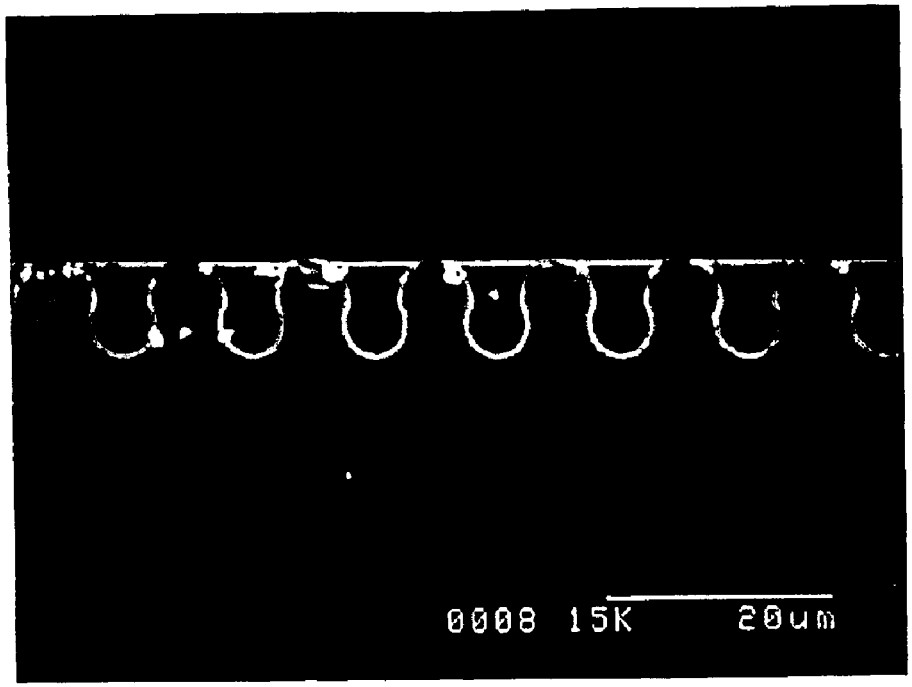
FIG. 5 is an SEM micrograph of the etched holes on an n-type silicon, formation by potentiostatic etching at 500 mV (vs.SCE) for 3600 seconds under emitting by SOW, 20000 Lx halogen light, according to an embodiment of the present invention.
Figure 6:
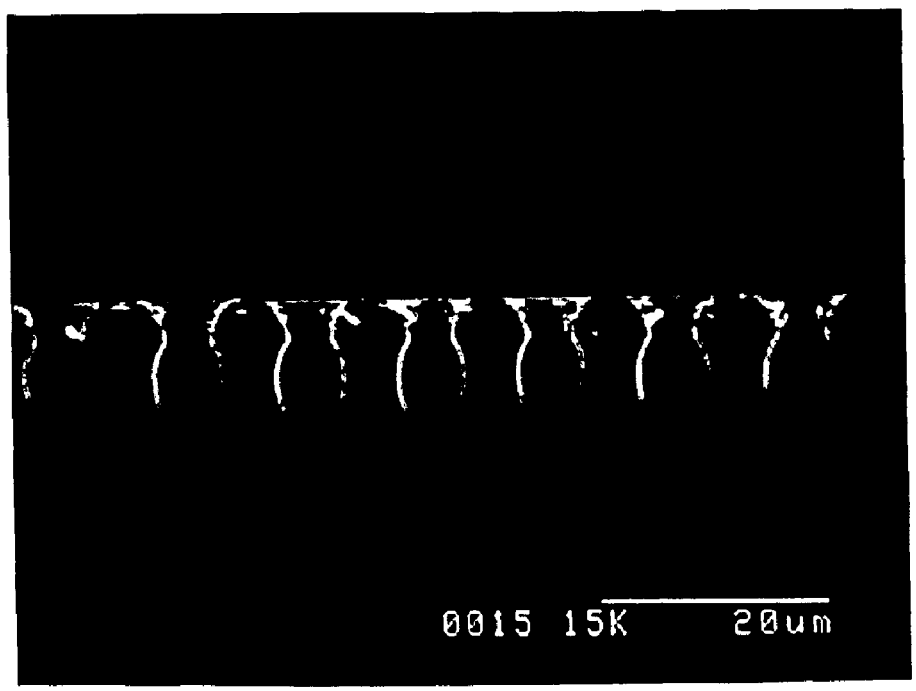
FIG. 6 is an SEM micrograph of the etched holes on an p-type silicon, formation by potentiostatic etching at 500 mV (vs.SCE) for 3600 seconds under emitting by 50 W, 20000 Lx halogen light, according to an embodiment of the present invention.

2. Taking an n-type and a p-type wafer after pre-etching respectively placed into 2.1 M ammonium fluoride solution, where a potential of 500 mV (vs. SCE) was applied, and etching for 3600 seconds in darkness can generate a deep-hole structure. Refer to FIG. 4A, after 3600 seconds etching in a potentiostatic the n-type wafer can not generate deep-holes, but the p-type wafer can generate deep-holes (refer to FIG. 4B).
3. The n-type wafer after pre-etching process is placed into 2.1 M ammonium fluoride solution, and a potential of 500 mV (vs. SCE) was applied. Illuminating the back of the wafer with 50 W, 11000 Lx halogen light and etching for 3600 seconds can generate a deep-hole structure. Refer to FIG. 5, the diameter of the wafer hole is 5 $\mu$m and the etching depth is 8.7 $\mu$m.
4. According to experiment 3 conditions, changing the emitted light to 50 W, 20000 Lx can produce an elliptical hole and etching depth is 11 $\mu$m (refer to FIG. 6).
5. The n-type wafer after pre-etching process is placed into the 2.1 M ammonium fluoride solution and a potential of 500 mV (vs. SCE) was applied. Illuminating the back of the wafer with 50 W, 20000 Lx halogen light and etching for 10800 seconds can generate a deep-hole structure (refer to FIG. 7).
6. According to the same experiment 5 conditions, increasing the potential to 500 mV can produce etched holes. (refer to FIG. 8)
7. According to the same experiment 5 conditions, increasing the potential to 1000 mV can produce etched holes. (refer to FIG. 9)
8. The p-type wafer after pre-etching process is placed into the 2.1 M ammonium fluoride solution and a potential of 500 mV (vs. SCE) was applied. Illuminating the back of the wafer with 50 W, 20000 Lx halogen light and etching for 10800 seconds can generate a deep-bole structure (refer to FIG. 10).
9. According to the same experiment 8 conditions, increasing the potential to 1000 mV can produce holes. (refer to FIG. 11)
10. Taking an n-type and a p-type wafer after pre-etching respectively and placing into 2.1 M ammonium fluoride solution and 2.1 M ammonium fluoride solution containing 1 M ammonium chloride solution and a potential of 500 mV (vs. SCE) was applied. Illuminating the back of wafer with 50 W, 20000 Lx halogen light and etching for 3600 seconds can generate a deep-whole structure. Refer to FIGS. 12A and 12B, additionally adding 1 M ammonium chloride solution, the etched rate increases two times in the photoelectrochemical etching process.
11. Taking an n-type wafer after pre-etching placed into 2.1 M ammonium fluoride solution and 0.5 M ammonium chloride solution, and a potential of 500 mV (vs. SCE) was applied. Illuminating the back of the wafer with 50 W, 20000 Lx halogen light and etches for 3600 seconds can generate a deep-hole structure. (refer to FIG. 13)
12. According to the same experiment 11 conditions, increasing the ammonium fluoride concentration to 1.5M can produce holes. (refer to FIG. 14)
13. Taking an n-type wafer after pre-etching placed into 2.1 M ammonium fluoride solution, and a potential of 500 mV (vs. SCE) was applied. Illuminating the back of the wafer with 50 W, 20000 Lx halogen light and etching for 10800 seconds at 10° C. can generate a deep-hole structure. (refer to FIG. 15)
14. According to the same experiment 13 conditions, increasing the temperature to 27° C. can produce holes. (refer to FIG. 8)
15. According to the same experiment 13 conditions, increasing the temperature to 50° C. can produce holes. The SEM of the hole is the same as FIG. 8, but the depth of hole increases 10%.
16. According to the same experiment 13 conditions, increasing the temperature to 90° C. can produce holes. The SEM of the hole is the same as FIG. 8, but the depth of hole increases 20%.
17. According to the same experiment 13 conditions, increasing the temperature to 95° C. can produce holes. Refer to FIG. 16, the appearance of the etching hole is not smooth and equable, and decreases application.
18. Taking an n-type wafer after pre-etching placed into 2.1 M ammonium fluoride solution and 1.0 M ammonium chloride solution, and a potential of 500 mV (vs. SCE) was applied. Illuminating the back of the wafer with 50 W, 20000 Lx halogen light and etching for 3600 seconds at 10~90° C. can generate a deep-hole structure. The appearance of the hole is the same as FIG. 12B, and the depth of the hole increased with the temperature increases. At 10~90° C., the appearance of the hole is smooth and equable until increasing to 95° C.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

REFERENCE

Hydrofluoric Acid
MSDS Number: H3994—Effective Date: Jul. 5, 2001
1. Product Identification
Synonyms: Fluorohydric acid; fluoric acid; Hydrogen fluoride solution
CAS No.: 7664-39-3
Molecular Weight: 20.01
Chemical Formula: HF in Aqueous Solution.
Product Codes: J. T. Baker: 5368, 5659, 5818, 5823, 5824, 5840, 5865, 6904, 9559, 9560, 9563, 9564, 9567, 9572, 9573, 9574, 9575
Mallinckrodt: 2640, 2648, V141, V580
2. Composition/Information on Ingredients
Ingredient CAS No Percent Hazardous
Hydrogen Fluoride 7664-39-3 48–52% Yes
Water 7732-18-5 48–52% No
3. Hazards Identification
Emergency Overview
POISON! DANGER! CORROSIVE. EXTREMELY HAZARDOUS LIQUID AND
1 of 10 Mar. 19, 2002 1:01 PM
HYDROFLUORIC ACID http://www.jtbaker.com/msds/H3994.htm
VAPOR. CAUSES SEVERE BURNS WHICH MAY NOT BE IMMEDIATELY PAINFUL OR VISIBLE. MAY BE FATAL IF SWALLOWED OR INHALED. LIQUID AND VAPOR CAN BURN SKIN, EYES AND RESPIRATORY TRACT. CAUSES BONE DAMAGE. REACTION WITH CERTAIN METALS GENERATES FLAMMABLE AND POTENTIALLY EXPLOSIVE HYDROGEN GAS.
J. T. Baker SAF-T-DATA(tm) Ratings (Provided here for your convenience) ps Health Rating: 4—Extreme (Poison)
Flammability Rating: 0—None
Reactivity Rating: 2—Moderate Contact Rating: 4—Extreme (Corrosive)
Lab Protective Equip: GOGGLES & SHIELD; LAB COAT & APRON; VENT HOOD;
PROPER GLOVES
Storage Color Code: White (Corrosive)
Potential Health Effects
Exposure to hydrofluoric acid can produce harmful health effects that may not be immediately apparent.
Inhalation:

Severely corrosive to the respiratory tract. May cause sore throat, coughing, labored breathing and lung congestion/inflammation.
Ingestion:
Corrosive. May cause sore throat, abdominal pain, diarrhea, vomiting, severe burns of the digestive tract, and kidney dysfunction.
Skin Contact:
Corrosive to the skin. Skin contact causes serious skin burns which may not be immediately apparent or painful. Symptoms may be delayed 8 hours or longer. The fluoride ion readily penetrates the skin causing destruction of deep tissue layers and even bone.
Eye Contact:
Corrosive to the eyes. Symptoms of redness, pain, blurred vision, and permanent eye damage may occur.
Chronic Exposure:
Intake of more than 6 mg of fluorine per day may result in fluorosis, bone and joint damage.
Hypocalcemia and hypomagnesemia can occur from absorption of fluoride ion into blood stream.
Aggravation of Pre-Existing Conditions:
Persons with pre-existing skin disorders, eye problems, or impaired kidney or respiratory function may be more susceptible to the effects of this substance.
4. First Aid Measures
HYDROFLUORIC ACID http:/www.jtbaker.com/msds/H3994.htm
For any route of contact: Detailed First Aid procedure should be planned before beginning work with HF.
Inhalation:
Get medical help immediately. If patient is unconscious, give artificial respiration or use inhalator.
Keep patient warm and resting, and send to hospital after first aid is complete.
Ingestion:
If swallowed, DO NOT INDUCE VOMITING. Give large quantities of water. Never give anything by mouth to an unconscious person. Get medical attention immediately.
Skin Contact:
1) Remove the victim from the contaminated area and immediately place him under a safety shower or wash him with a water hose, whichever is available. 2) Remove all contaminated clothing. Handle all HF-contaminated material with gloves made of appropriate material, such as PVC or neoprene.
3) Keep washing with large amounts of water for a minimum of 15 minutes. 4) Have someone make arrangements for medical attention while you continue flushing the affected area with water. 5) If the following materials are available, limit the washing to five minutes and immerse the burned area in a solution of 0.2% iced aqueous Hyamine 1622 or 0.13% iced aqueous Zephiran Chloride. If immersion is not practical, towels should be soaked with one of the above solutions and used as compresses for the burn area. Ideally compresses should be changed every 2 minutes.
Alternately, 2.5% calcium gluconate gel should be massaged into the affected area. 6) Seek medical attention as soon as possible for all burns regardless of how minor they may appear initially. Hyamine 1622 is a trade name for tetracaine benzethonium chloride, Merck Index Monograph 1078, a quaternary ammonium compound sold by Rohm & Haas, Philadelphia Zephiran Chloride is a trade name for benzalkonium chloride, Merck Index Monograph 1059, also a quaternary ammonium compound, sold by Sanofi-Synthelabo Inc., New York, N.Y.

Eye Contact:
1) Irrigate eyes for at least 30 minutes with copious quantities of water, keeping the eyelids apart and away from eyeballs during irrigation. 2) Get competent medical attention immediately, preferably an eye specialist. 3) If a physician is not immediately available, apply one or two drops of ophthalmic anesthetic, (e.g., 0.5% Pontocaine Hydrochloride solution). 4) Do not use oily drops, ointment or HF skin burn treatments. Place ice pack on eyes until reaching emergency room.
Note to Physician:
General: For burns of moderate areas, (greater than 8 square inches), ingestion and significant inhalation exposure, severe systemic effects may occur, and admission to a critical care unit should be considered. Monitor and correct for hypocalcemia, cardiac arrhythmias, hypomagnesemia and hyperkalemia. In some cases renal dialysis may be indicated. Inhalation: Treat as chemical pneumonia. Monitor for hypocalcemia, 2.5% calcium gluconate in normal saline by nebulizer or by IPPB with 100% oxygen may decrease pulmonary damage. Bronchodilators may also be administered. Skin: For deep skin burns or contact with concentrated HF (over 50%) solution, consider infiltration about the affected area with 5% calcium gluconate [equal parts of 10% calcium gluconate and sterile saline for injection]. Burns beneath the nail may require splitting the nail and application of calcium gluconate to the exposed nail bed. For certain burns, especially of the digits, use of intra-arterial calcium gluconate may be indicated. Eyes: Irrigation may be facilitated by use of Morgan lens or similar ocular irrigator, using 1% aqueous calcium gluconate solution [50 ml of calcium gluconate 10% in 500 ml normal saline]. AN ALTERNATIVE FIRST AID PROCEDURE: The effect of HF, i.e. onset of pain, particularly in dilute solutions, may not be felt for up to 24 hours. It is important, therefore, that persons using HF have immediate access to an 3 of 10 Mar. 19, 2002 1:01 PM
HYDROFLUORIC ACID http://www. jtbaker.com/msds/H3994.htm effective antidote even when they are away from their work place in order that first aid treatment can be commenced immediately. We recommend that any person in contact with HF should carry, or have access to a tube of HF Antidote Gel at all times; ideally with one tube at the work place, one on the person and one at home. It is imperative that any person who has been contaminated by HF should seek medical advice when the treatment by HF Antidote Gel has been applied.
REFERENCES: 1. Browno, T. D. Treatment of Hydrofluoric Acid Burns 2. Sprout, W. L. et al Treatment of Severe Hydrofluoric Acid Exposures (Journal of American Occupational Medicine 25:12, 1993) 3. Bracken, W. M. et al Comparative Effectiveness of Topical Treatments for Hydrofluoric Acid Burns, University of Kansas (Journal of Occupational Medicine 27:10:1985)4.
Burke, W. J., et al Systemic Fluoride Poisoning Resulting from A Fluoride Skin Burn (Journal of Occupational Medicine (5,39:1973) HF ANTIDOTE GEL: Distributed by Pharmascience Inc. 8400 Darnley Rd. Montreal, Canada. H4T IM4 Phone: (514) 340-1114 Fax: (514) 342-7764 U.S. (Buffalo, N.Y.) distributor: 1-800-207-4477
5. Fire Fighting Measures
Fire:
Not considered to be a fire hazard. Fire may produce poisonous or irritating gases.
Explosion:
Violent exothermic reaction occurs with water. Sufficient heat may be produced to ignite combustible materials. Reacts with metals forming flammable Hydrogen gas.

Fire Extinguishing Media:
Keep upwind of fire. Use water or carbon dioxide on fires in which Hydrofluoric Acid is involved.
Halon or foam may also be used. In case of fire, the sealed containers can be kept cool by spraying with water.
Special Information:
In the event of a fire, wear full protective clothing and NIOSH-approved self-contained breathing apparatus with full facepiece operated in the pressure demand or other positive pressure mode.
Avoid getting water in tanks or drums; water can cause generation of heat and spattering. In contact with air, the acid gives off corrosive fumes which are heavier than air.

6. Accidental Release Measures

Notify safety personnel, provide adequate ventilation, and remove ignition sources since hydrogen may be generated by reactions with metals. Wear appropriate personal protective equipment as specified in Section 8. Do not flush to sewers or waterways. Spills: Evacuate the danger area. Apply magnesium sulfate (dry) to the spill area. Follow up with inert absorbent and add soda ash or magnesium oxide and slaked lime. Collect in appropriate plastic containers and save for disposal.
Wash spill site with soda ash solution. NOTE: Porous materials (concrete, wood, plastic, etc.) will absorb HF and become a hazard for an indefinite time. Such spills should be cleaned and neutralized immediately. US Regulations (CERCLA) require reporting spills and releases to soil, water and air in excess of reportable quantities. The toll free number for the US Coast Guard National Response Center is (800) 424-8802.
4 of 10 Mar. 19, 2002 1:01 PM
HYDROFLUORIC ACID http://www.jtbaker.com/msds/H3994.htm
J. T. Baker TEAMS® 'Low Na+' acid neutralizer is recommended for spills of this product.

7. Handling and Storage

Keep in tightly closed polyethylene containers. Store in a cool, dry place with adequate ventilation separated from other chemicals. Protect from physical damage. Storage facilities should be constructed for containment and neutralization of spills. Handling and storage of HF requires special materials and technology for containers, pipes, valves, etc., which is available from suppliers.
Containers of this material may be hazardous when empty since they retain product residues (vapors, liquid); observe all warnings and precautions listed for the product.

8. Exposure Controls/Personal Protection

Airborne Exposure Limits:
Hydrogen fluoride:
—OSHA Permissible Exposure Limit (PEL):
3 ppm (TWA)
ACGIH Threshold Limit Value (TLV):
3 ppm Ceiling as F
Ventilation System:
A system of local and/or general exhaust is recommended to keep employee exposures as low as possible. Local exhaust ventilation is generally preferred because it can control the emissions of the contaminant at its source, preventing dispersion of it into the general work area.
Please refer to the ACGIH document, *Industrial Ventilation, A Manual of Recommended Practices*, most recent edition, for details.
Personal Respirators (NIOSH Approved):
If the exposure limit is exceeded, a full facepiece respirator with an acid gas cartridge may be worn up to 50 times the exposure limit or the maximum use concentration specified by the appropriate regulatory agency or respirator supplier, whichever is lowest. For emergencies or instances where the exposure levels are not known, use a full-facepiece positive-pressure, air-supplied respirator.
WARNING: Air purifying respirators do not protect workers in oxygen-deficient atmospheres.
Since the IDLH is low (30 ppm), the above cartridge system is not specifically approved for HF.
(3M Respirator Selection Guide)
Skin Protection:
Wear protective clothing, including boots or safety shoes with polyvinyl chloride (PVC) or neoprene. Use chemical goggles and/or a full face shield. Wear coveralls with long sleeves, gauntlets and gloves of PVC or neoprene. A high degree of protection is obtained with an air-inflated suit with mask and safety belt. Use protection suitable for conditions.
Eye Protection:
Use chemical safety goggles and/or full face shield where splashing is possible.
Maintain eye wash fountain and quick drench facilities in work area.
5 of 10 Mar. 19, 2002 1:01 PM HYDROFLUORIC ACID
http://www.jtbaker.com/msds/H3944.htm 9. Physical and Chemical Properties Appearance:
Colorless, fuming liquid.
Odor:
Acrid odor. Do not breathe fumes.
Solubility:
Infinitely soluble.
Specific Gravity:
1.15–1.18
pH:
1.0 (0.1M solution)
% Volatiles by volume @ 21 C. (70 F.):
100 (as water and acid)
Boiling Point:
108 C. (226 F.)
Melting Point:
<−36 C. (<−33 F.)
Vapor Density (Air=1):
1.97
Vapor Pressure (mm Hg):
25 @ 20 C. (68 F.)
Evaporation Rate (BuAc=1):
No information found.

10. Stability and Reactivity

Stability:
Stable at room temperature (68 F.) when stored and used under proper conditions.
Hazardous Decomposition Products:
On contact with metals, liberates hydrogen gas. On heating to decomposition, could yield toxic fumes of fluorides. Attacks glass and other silicon containing compounds. Reacts with silica to produce silicon tetrafluoride, a hazardous colorless gas.
Hazardous Polymerization:
Will not occur.
Incompatibilities:
Hydrofluoric acid is incompatible with arsenic trioxide, phosphorus pentoxide, ammonia, calcium oxide, sodium hydroxide, sulfuric acid, vinyl acetate, ethylenediamine, acetic anhydride, alkalis, organic materials, most common metals, rubber, leather, water, strong bases, carbonates, sulfides, cyanides, oxides of silicon, especially glass, concrete, silica, fluorine. Will also react with steam or water to produce toxic fumes.

Conditions to Avoid:
Moisture and incompatibles.
6 of 10 Mar. 19, 2002 1:01 PM
HYDROFLUORIC ACID http:/www.jtbaker.com/msds/H3994.htm
11. Toxicological Information
Hydrofluoric acid: Inhalation rat LC50: 1276 ppm/1H; Investigated as a mutagen, reproductive effector.
\Cancer Lists\
NTP Carcinogen
Ingredient Known Anticipated IARC Category
Hydrogen Fluoride (7664-39-3) No No None
Water (7732-18-5) No No None
12. Ecological Information
Environmental Fate:
If the pH is >6.5, soil can bind fluorides tightly. High calcium content will immobilize fluorides, which can be damaging to plants when present in acid soils.
Environmental Toxicity:
This material is expected to be slightly toxic to aquatic life. 60 ppm/*/Fish/Lethal/Fresh Water *=time period not specified. >300 ppm/48 hr./Shrimp/LC50/Aerated Saltwater
13. Disposal Considerations
Whatever cannot be saved for recovery or recycling should be handled as hazardous waste and sent to a RCRA approved incinerator or disposed in a RCRA approved waste facility. Processing, use or contamination of this product may change the waste management options. State and local disposal regulations may differ from federal disposal regulations. Dispose of container and unused contents in accordance with federal, state and local requirements.
14. Transport Information
Domestic (Land, D.O.T.)
Proper Shipping Name: RQ, HYDROFLUORIC ACID (WITH NOT MORE THAN 60% STRENGTH)
Hazard Class: 8, 6.1
UN/NA: UN1790
Packing Group: II
Information reported for product/size: 250 LB
7 of 10 Mar. 19, 2002 1:01 PM
HYDROFLUORIC ACID http://www.jtbaker.com/msds/H3994.htm
International (Water, I.M.O.)
Proper Shipping Name: HYDROFLUORIC ACID (WITH NOT MORE THAN 60% STRENGTH)
Hazard Class: 8, 6.1
UNINA: UN1790
Packing Group: II
Information reported for product/size: 250 LB
15. Regulatory Information
\Chemical Inventory Status—Part 1\
Ingredient TSCA EC Japan Australia
Hydrogen Fluoride (7664-39-3) Yes Yes Yes Yes
Water (7732-18-5) Yes Yes Yes Yes
\Chemical Inventory Status—Part 2\
Canada
Ingredient Korea DSL NDSL Phil.
Hydrogen Fluoride (7664-39-3) Yes Yes No Yes
Water (7732-18-5) Yes Yes No Yes
\Federal, State & International Regulations—Part 1\
SARA 302 SARA 313
Ingredient RQ TPQ List Chemical Catg.
Hydrogen Fluoride (7664-39-3) 100 100 Yes No
Water (7732-18-5) No No No No
\Federal, State & International Regulations—Part 2\
RCRA TSCA
Ingredient CERCLA 261.33 8(d)
Hydrogen Fluoride (7664-39-3) 100 U134 No
Water (7732-18-5) No No No
Chemical Weapons Convention: Yes TSCA 12(b): No CDTA: No
SARA 311/312: Acute: Yes Chronic: Yes Fire: No Pressure: No Reactivity: Yes (Mixture/Liquid)
Australian Hazchem Code: 2R
Poison Schedule: S7
WHMIS:
This MSDS has been prepared according to the hazard criteria of the Controlled Products
Regulations (CPR) and the MSDS contains all of the information required by the CPR.
8 of 10 Mar. 19, 2002 1:01 PM
HYDROFLUORIC ACID http://www.jtbaker.com/msds/H3994.htm
16. Other Information
NFPA Ratings: Health: 4 Flammability: 0 Reactivity: 1
Label Hazard Warning:
POISON! DANGER! CORROSIVE. EXTREMELY HAZARDOUS LIQUID AND VAPOR. CAUSES SEVERE BURNS WHICH MAY NOT BE IMMEDIATELY PAINFUL OR VISIBLE. MAY BE FATAL IF SWALLOWED OR INHALED. LIQUID AND VAPOR CAN BURN SKIN, EYES AND RESPIRATORY TRACT. CAUSES BONE DAMAGE. REACTION WITH CERTAIN METALS GENERATES FLAMMABLE AND POTENTIALLY EXPLOSIVE HYDROGEN GAS.
Label Precautions:
Do not get in eyes, on skin, or on clothing.
Do not breathe vapor.
Cool before opening.
Use only with adequate ventilation.
Wash thoroughly after handling.
Store in a tightly closed container.
Label First Aid:
IN ALL CASES, CALL PHYSICIAN IMMEDIATELY. First Aid procedures should be pre-planned for HF emergencies. A supply of 50:50 water/magnesium sulfate paste or 2 1/2% Calcium Gluconate paste should be available where first aid medications are administered. If ingested, DO NOT INDUCE VOMITING. If patient is conscious, give large quantities of milk or water and send to hospital. If inhaled and patient is unconscious, give artificial respiration or use inhalator and send to hospital. In case of eye contact, wash open eyes with large but gentle stream of water for 15 minutes. Place ice pack on eyes until reaching emergency room. In case of skin contact, remove contaminated clothing and wash burn area with plenty of water to remove acid. Cover burn area with a poultice of 50:50 water/magnesium sulfate paste or 2 ½% calcium gluconate paste. Leave in place until medical help arrives or patient is transferred to hospital.
Product Use:
Laboratory Reagent.
Revision Information:
MSDS Section(s) changed since last revision of document include: 4.
Disclaimer:
Mallinckrodt Baker, Inc. provides the information contained herein in good faith but makes no representation as to its comprehensiveness or accuracy. This document is intended only as a guide to the appropriate precautionary handling of the material by a properly trained person using this product. Individuals receiving the information must exercise their independent judgment in determining its appropriateness for a particular purpose. MALLINCKRODT BAKER, INC.

MAKES NO REPRESENTATIONS OR WARRANTIES, EITHER EXPRESS OR IMPLIED, INCLUDING WITHOUT LIMITATION ANY WARRANTIES OF MERCHANTABILITY, FITNESS FOR A PARTICULAR PURPOSE WITH RESPECT TO THE INFORMATION SET FORTH HEREIN OR THE PRODUCT TO WHICH THE INFORMATION REFERS.

9 of 10 Mar. 19, 2002 1:01 PM

HYDROFLUORIC ACID http://www.jtbaker.com/msds/H3994.htm

ACCORDINGLY, MALLINCKRODT BAKER, INC. WILL NOT BE RESPONSIBLE FOR DAMAGES RESULTING FROM USE OF OR RELIANCE UPON THIS INFORMATION.

Prepared by: Environmental Health & Safety

Phone Number: (314) 654–1600 (U.S.A.)

10 of 10 Mar. 19, 2002 1:01 PM

HYDROFLUORIC ACID http://www.jtbaker.com/msds/H3994.htm

What is claimed is:

1. A method for using ammonium fluoride solution in photoelectrochemistry etching process of a silicon wafer, comprising the steps of:

placing the wafer after a pre-etching process into an alcohol solution for activating the surface of the wafer and into an ammonium fluoride solution for an etching solution; and illuminating the back of the wafer with a halogen light and performing a photoelectrochemical etching process in a potentiostat.

2. The method of claim 1, wherein the concentration of ammonium fluoride is from 1.0 to 2.5 M.

3. The method of claim 1, further comprising a step of:

adding an ammonium chloride solution within the photoelectrochemical etching process in potentiostat.

4. The method of claim 3, wherein the concentration of the ammonium chloride solution is from 0.1 to 1.5 M.

5. The method of claim 1, wherein the brightness of halogen light is 11,000 to 20,000 lux.

6. The method of claim 1, wherein the potential of the potentiostat is from 0.25 V to 1.0 V.

7. The method of claim 1, wherein the temperature of the photoelectrochemical ethching process is from 10 to 90° C.

* * * * *